United States Patent
Bathan et al.

(10) Patent No.: US 8,723,338 B2
(45) Date of Patent: May 13, 2014

(54) INTEGRATED CIRCUIT PACKAGING SYSTEM WITH ARRAY CONTACTS AND METHOD OF MANUFACTURE THEREOF

(75) Inventors: Henry Descalzo Bathan, Singapore (SG); Zigmund Ramirez Camacho, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/586,178

(22) Filed: Aug. 15, 2012

(65) Prior Publication Data

US 2014/0048919 A1 Feb. 20, 2014

(51) Int. Cl.
*H01L 23/48* (2006.01)
*H01L 23/52* (2006.01)
*H01L 29/40* (2006.01)

(52) U.S. Cl.
USPC .................. 257/784; 257/708; 438/121

(58) Field of Classification Search
USPC .......... 257/666, 676, 699, 784, 708; 438/111, 438/121, 123
See application file for complete search history.

(56) References Cited

U.S. PATENT DOCUMENTS

| | | | |
|---|---|---|---|
| 5,656,830 A | 8/1997 | Zechman | |
| 6,498,392 B2 * | 12/2002 | Azuma | 257/676 |
| 6,689,640 B1 * | 2/2004 | Mostafazadeh | 438/121 |
| 6,975,038 B1 | 12/2005 | Mostafazadeh | |
| 7,064,419 B1 * | 6/2006 | Bayan et al. | 257/666 |
| 7,186,588 B1 | 3/2007 | Bayan et al. | |
| 7,846,775 B1 | 12/2010 | Lee et al. | |
| 7,915,716 B2 * | 3/2011 | Pisigan et al. | 257/666 |
| 2005/0275077 A1 * | 12/2005 | Tan et al. | 257/678 |
| 2009/0039498 A1 * | 2/2009 | Bayerer | 257/700 |
| 2009/0315161 A1 * | 12/2009 | Bayan et al. | 257/666 |
| 2011/0233752 A1 * | 9/2011 | Camacho et al. | 257/692 |

* cited by examiner

*Primary Examiner* — S. V. Clark
(74) *Attorney, Agent, or Firm* — Ishimaru & Associates LLP

(57) ABSTRACT

A method of manufacture of an integrated circuit packaging system includes: providing an array of leads having a jumper lead and a covered contact; coupling an insulated bonding wire between the jumper lead and the covered contact; attaching an integrated circuit die over the covered contact; and coupling a bond wire between the integrated circuit die and the jumper lead including coupling the integrated circuit die to the covered contact through the insulated bonding wire.

20 Claims, 8 Drawing Sheets

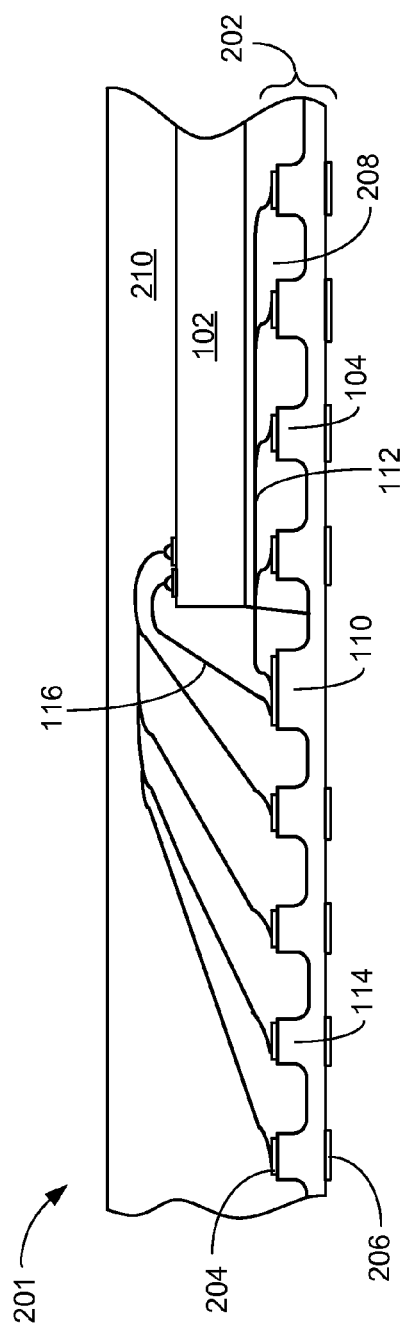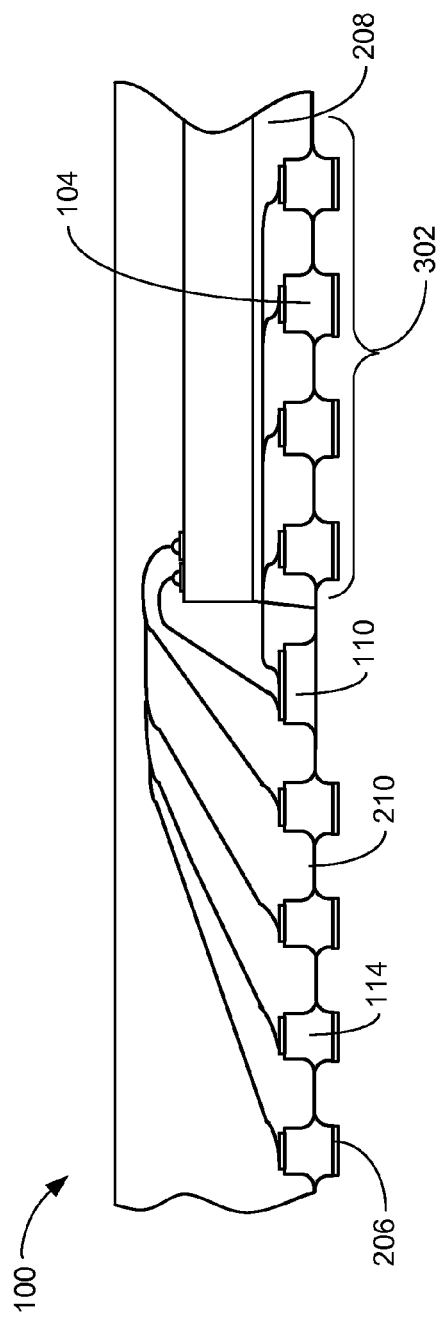

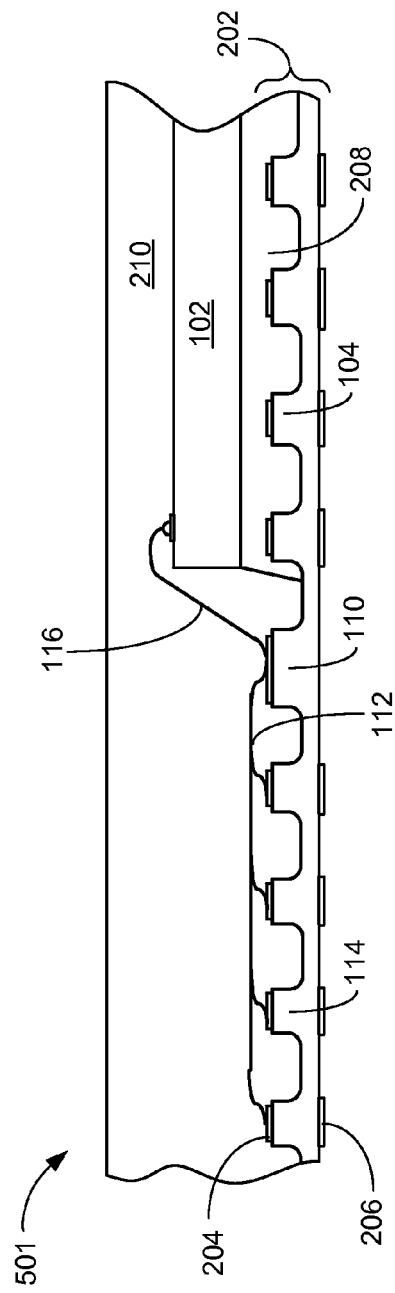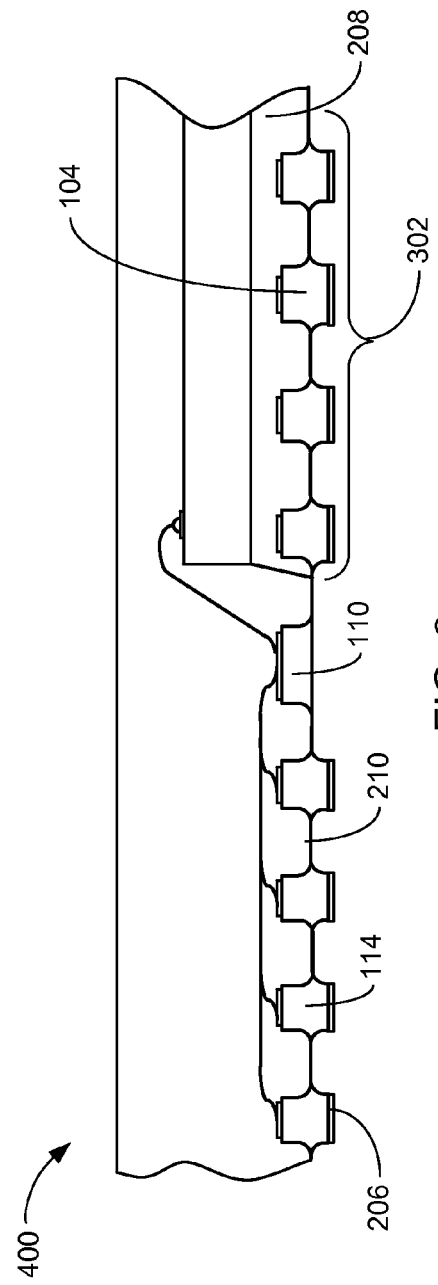

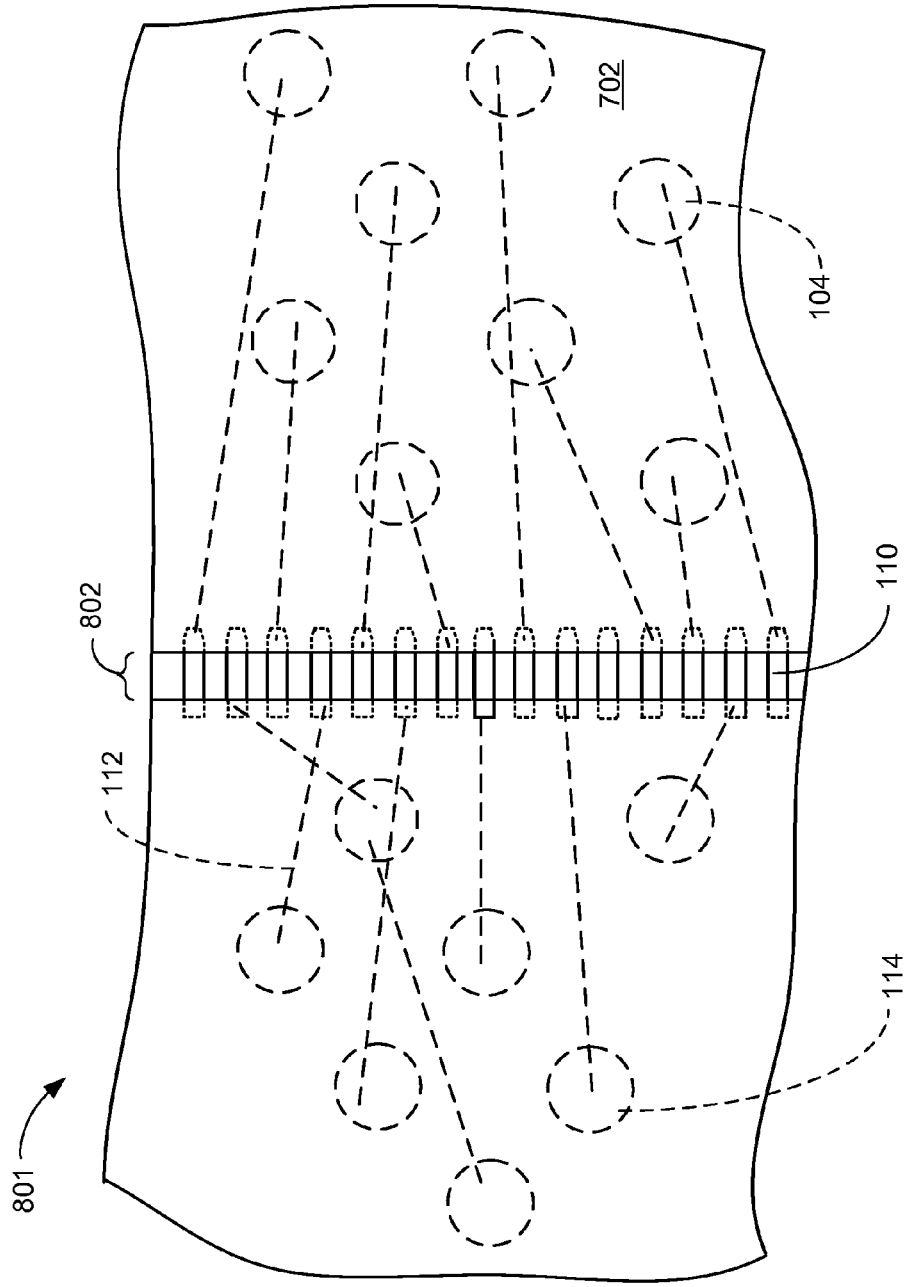

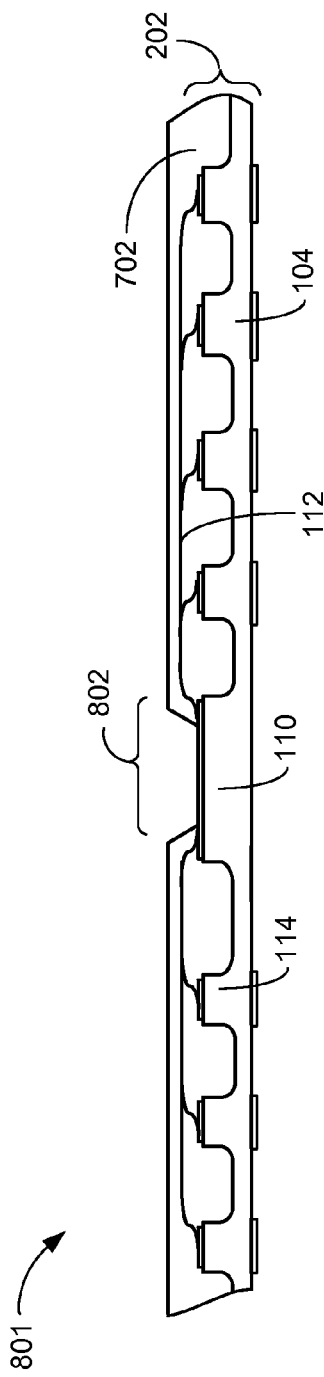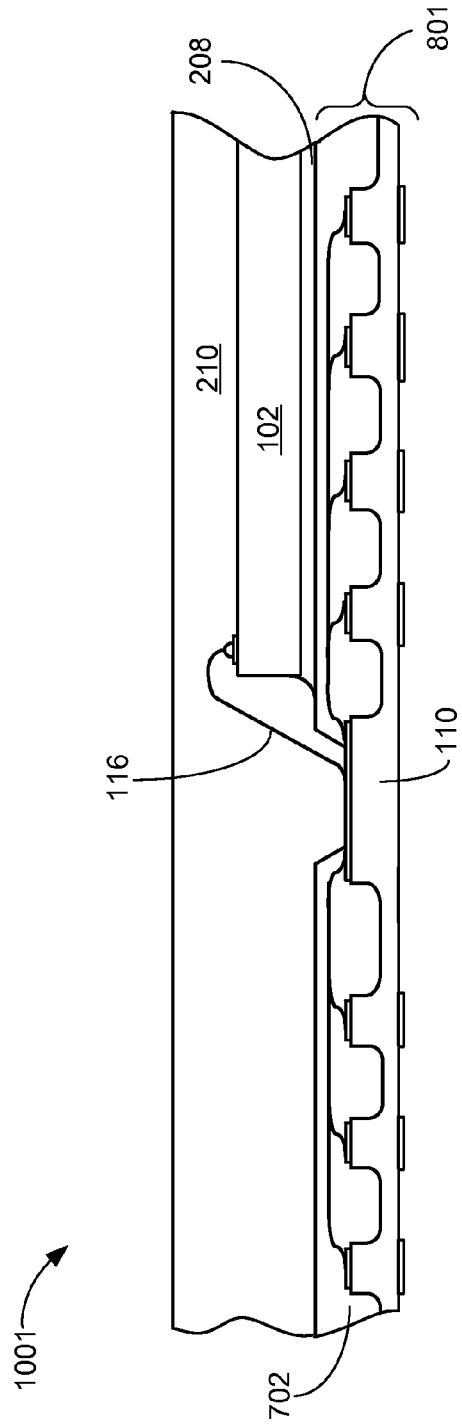

INTEGRATED CIRCUIT PACKAGING SYSTEM WITH ARRAY CONTACTS AND METHOD OF MANUFACTURE THEREOF

TECHNICAL FIELD

The present invention relates generally to integrated circuit systems, and more particularly to a system for integrated circuit packages with arrays of contacts.

BACKGROUND ART

Increasing demand across virtually all aspects of modern life is driving improvements in integrated circuit technology. For essentially all applications, there continues to be demand for reducing cost, size, and increasing performance of electronic packages. Generally, an electronic package is defined as the case and interconnection for integrated circuits also referred to as 'semiconductor device', 'chip' or 'die'.

The case and interconnection can form an electronic system that can provide interfacing and integration with a next level electronic system. The electronic package should provide a structure physically supporting the integrated circuit and protecting the integrated circuit from the environment, a means for removing heat generated by the integrated circuits or system, or electrical connections to provide signal and power access to and from the integrated circuit. As the demand continues to grow for smaller, cheaper, and faster electronic products, manufacturers are seeking ways to cost effectively include more connections within a similar or smaller product size.

Thus, a need still remains for an integrated circuit package system to provide improved connectivity, pricing, and dimensions. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an array of leads having a jumper lead and a covered contact; coupling an insulated bonding wire between the jumper lead and the covered contact; attaching an integrated circuit die over the covered contact; and coupling a bond wire between the integrated circuit die and the jumper lead including coupling the integrated circuit die to the covered contact through the insulated bonding wire.

The present invention provides an integrated circuit packaging system including: an array of leads includes a jumper lead and a covered contact; an insulated bonding wire attached between the jumper lead and the covered contact; an integrated circuit die mounted over the covered contact; and a bond wire coupled between the integrated circuit die and the jumper lead includes the integrated circuit die coupled to the covered contact through the insulated bonding wire.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 2 is a cross-sectional view of the integrated circuit packaging assembly along line 2-2 of FIG. 1 in a molding phase of manufacturing.

FIG. 3 is a cross-sectional view of the integrated circuit packaging system of FIG. 1 in a lead isolation phase of manufacturing.

FIG. 5 is a cross-sectional view of an integrated circuit packaging assembly along line 5-5 of FIG. 4 in molding phase of manufacturing.

FIG. 6 is a cross-sectional view of the integrated circuit packaging system of FIG. 4 in a lead isolation phase of manufacturing.

FIG. 8 is a top plan view of a substrate assembly of the integrated circuit packaging system of FIG. 7 in a substrate assembly forming phase of manufacturing.

FIG. 9 is a cross-sectional view of the substrate assembly of the integrated circuit packaging system of FIG. 7 in a first encapsulation phase of manufacturing.

FIG. 10 is a cross-sectional view of a package assembly of the integrated circuit packaging system of FIG. 7 in a second encapsulation phase of manufacturing.

BEST MODE FOR CARRYING OUT THE INVENTION

Figure 1:
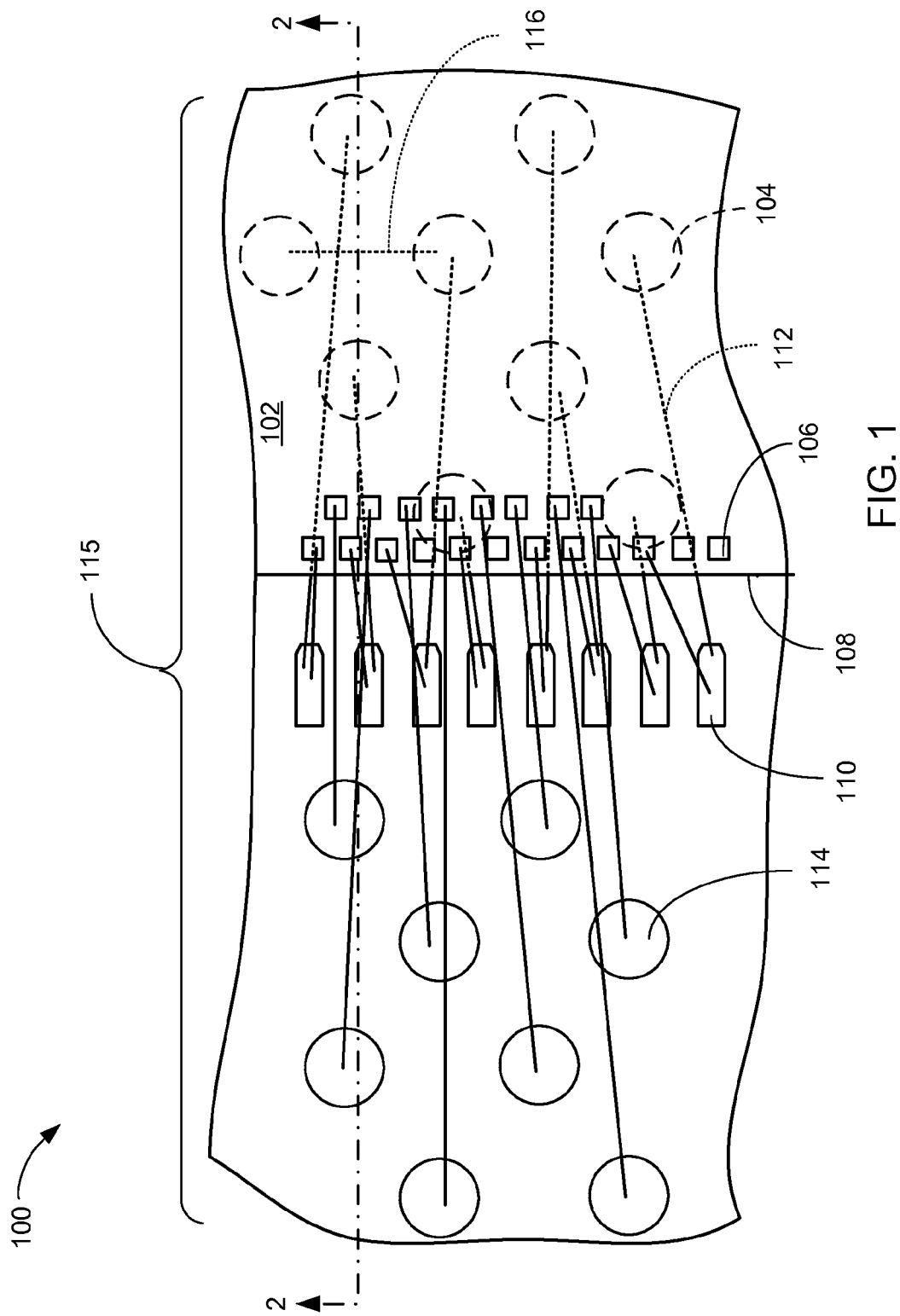
FIG. 1 is a top plan view of a portion of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described having some features in common, for clarity and ease of illustration, description, and comprehension thereof, similar and like features one to another will ordinarily be described with similar reference numerals.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the active surface an integrated circuit of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" as used herein means and refers to direct contact between adjoining elements. The term "processing" as used herein includes deposition of material or photoresist, patterning, exposure, development, etching, cleaning, and/or removal of the material or photoresist as required in forming a described structure.

Referring now to FIG. 1, therein is shown a top plan view of a portion of an integrated circuit packaging system 100 in a first embodiment of the present invention. The top plan view of the integrated circuit packaging system 100 depicts an integrated circuit die 102 positioned over an array of covered contacts 104. The integrated circuit die 102 can include an active side facing away from the covered contacts. Bonding pads 106 of the integrated circuit die 102 can be positioned in rows along a singulated edge 108 of the integrated circuit die 102.

A row of jumper leads 110 are formed spaced away from the singulated edge 108 of the integrated circuit die 102. The jumper leads 110 can be coupled to the covered contacts 104 by insulated bonding wires 112. The insulated bonding wires 112 can be coupled to the jumper leads 110 and extend under the integrated circuit die 102 in order to couple to the covered contacts 104. When the integrated circuit die 102 is mounted over the insulated bonding wires 112 and the covered contacts 104, a signal connection is made by coupling the bonding pads 106 to the jumper leads 110.

The bonding pads 106 can be coupled to an array of coupling contacts 114 that can be formed beyond the jumper leads 110. Bond wires 116 can couple directly between the bonding pads 106 and the coupling contacts 114.

An array of leads 115, including the covered contacts 104, the jumper leads 110, and the coupling contacts 114, when combined with the insulated bonding wires 112 can provide the function of a multi-layer ball grid array package in a thinner and less expensive implementation.

The insulated bonding wire 112 can be used to form multiple connections by adding a second insulated bonding wire 116 between the covered contacts 104. The path of the second insulated bonding wire is not an issue because the electrical contact is only made at the ends of the insulated bonding wires 112 so no short circuits are possible. This feature of the insulated bonding wires 112 allows complicated interconnect patterns to be achieved without the need for additional thickness in the integrated circuit packaging system 100.

It has been discovered that use of the jumper leads 110 and the insulated bonding wires 112 can provide the functions of a ball grid array without requiring a costly multi-level substrate (not shown). The integrated circuit packaging system 100 can provide the flexibility of implementing a complicated interconnect pattern without requiring modifications to the integrated circuit die 102. It has further been discovered that by coupling the integrated circuit die 102 with the jumper leads 110 and the coupling contacts 114 an improved wire sweep pattern can be achieved which will improve the manufacturing yield and reduce costs.

A section line 2-2 indicates the general region of the integrated circuit packaging system 100 that represents the cross-sectional view of FIG. 2.

Referring now to FIG. 2, therein is shown a cross-sectional view of the integrated circuit packaging assembly 201 along line 2-2 of FIG. 1 in a molding phase of manufacturing. The cross-sectional view of the integrated circuit packaging assembly 201 depicts a lead frame 202 having the jumper leads 110, the covered contacts 104 and the coupling contacts 114 formed in a prior manufacturing step. The lead frame 202 can be formed by a combination stamping, etching, or both on a metal sheet that can be formed of copper (Cu), tin (Sn), or an alloy.

A deposited bond site 204 can be formed on the upper surface of the jumper leads 110, the covered contacts 104 and the coupling contacts 114 in order to enhance the coupling capability of the insulated bonding wires 112 and the bond wires 116. The deposited bond site 204 can be plated, sputtered, screen printed, or a combination thereof. It is understood that the deposited bond site 204 of the jumper leads 110 can be larger than the deposited contact of the covered contacts or the coupling contacts in order to provide two contact areas for the insulated bonding wires 112 and the bond wires 116.

An array of system coupling sites 206 can be formed directly under the deposited bond sites 204 of the covered contacts 104 and the coupling contacts 114 but no system coupling sites 206 are formed under the jumper leads 110. The system coupling sites 206 can be plated, sputtered, or silk screened on the bottom side of the lead frame 202. The system coupling sites 206 can form an etch stop layer on the bottom of the lead frame 202 for further processing.

A die mounting adhesive 208, such as a "B" stage epoxy, die attach material, or as cured epoxy can fill the space beneath the integrated circuit die 102 to partially enclose the insulated bonding wires 112 and completely enclose the covered contacts 104 and the deposited bond sites 204. It is further understood that the die mounting adhesive 208 can be a material having a low-K dielectric constant. The insulated bonding wires 112 can be physically and electrically isolated from the active side of the integrated circuit die 102 by the physical spacing and the electrical resistance of the low-K material of the die mounting adhesive 208.

A package encapsulation 210 can be formed on the integrated circuit die 102, the bond wires 116, the insulated bonding wires112, the die mounting adhesive 208, and the coupling contacts 114. The package encapsulation 210 does not extend beneath the integrated circuit die 102 so it does not come in contact with the covered contacts 104.

Referring now to FIG. 3, therein is shown a cross-sectional view of the integrated circuit packaging system 100 of FIG. 1 in a lead isolation phase of manufacturing. The cross-sectional view of the integrated circuit packaging system 100 depicts the array 302 of the covered contacts 104 can be isolated from each other by a lead isolation process, such as etching or laser ablation.

The jumper leads 110 can be reduced in thickness by the lead isolation process. It is understood that the system contact site 206 is not present under the jumper leads 110 so they are fully reduced to an expected thickness and will not be coupled to the next level system (not shown). The reduction in thickness of the jumper lead 110 is capable of precision control in the manufacturing process.

The system contact site 206 can block the thinning process of the lead isolation process. The exposed areas of the lead frame 202 of FIG. 2 are reduced in thickness until all of the material coupling the jumper leads 110, the covered contacts 104 and the coupling contacts 114 has been removed. The package encapsulation 210 is exposed between the coupling contacts 114. The covered contacts 104 are completely surrounded by the die mounting adhesive 208.

Figure 4:
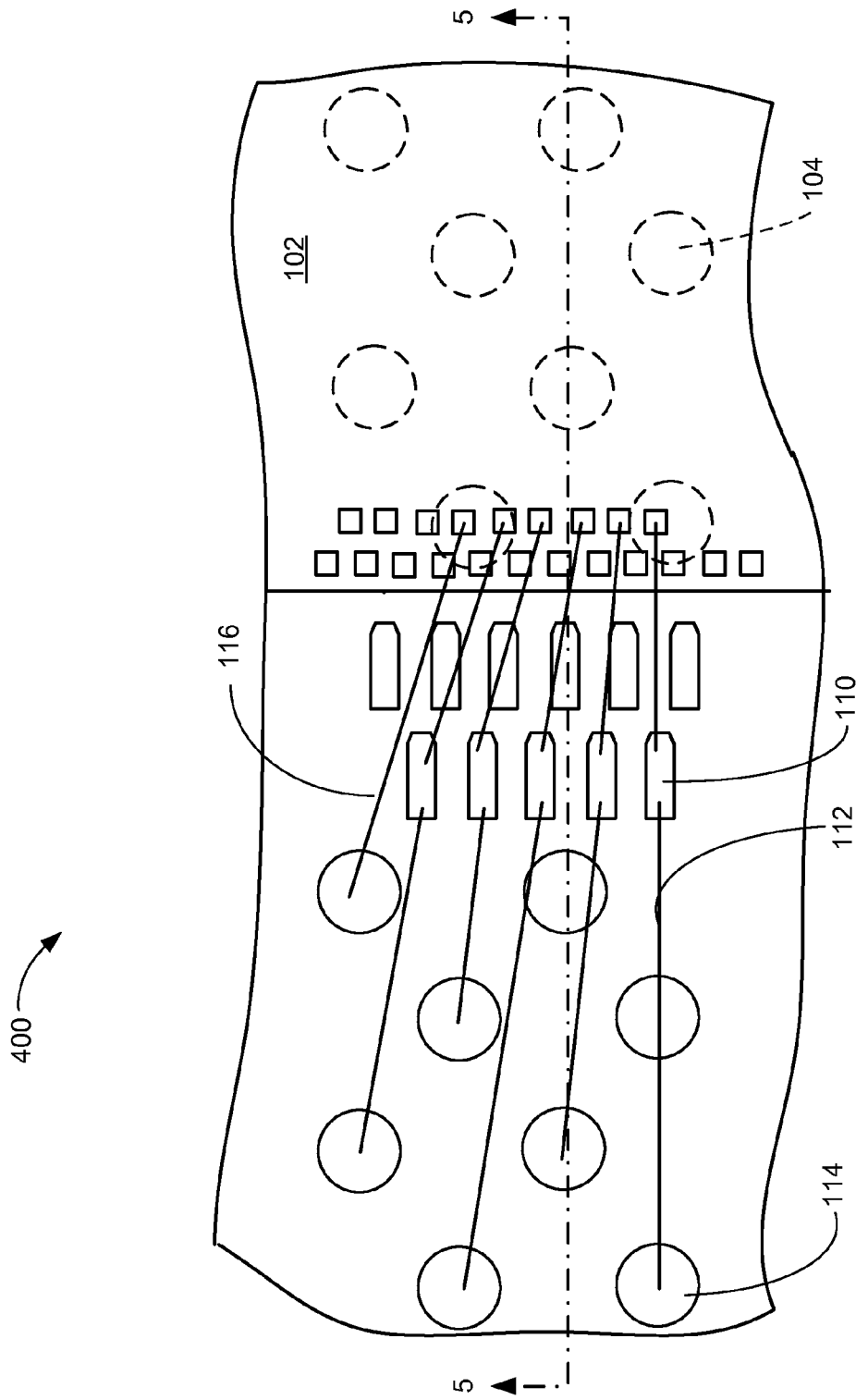
FIG. 4 is a top plan view of an integrated circuit packaging system in a second embodiment of the present invention.

Referring now to FIG. 4, therein is shown a top plan view of an integrated circuit packaging system 400 in a second embodiment of the present invention. The top plan view of an integrated circuit packaging system 400 depicts the integrated circuit die 102 mounted over the covered contacts 104. The jumper leads 110 can be used to reduce the wiring congestion during the assembly process.

The bond wires 116 and the insulated bonding wires 112 do not extend beneath the integrated circuit die 102. The insulated bonding wires 112 can cross each other's path without causing any short circuits. The manufacturing yield can be improved by the shorter length of the bond wires 116 and the extension of the signal from the jumper leads 110 to the coupling contacts 114.

It has been discovered that the jumper lead 110 in use with the insulated bonding wires 112 can help eliminate wire sweep issues in the manufacturing process. By applying the bond wires 116 to the coupling contacts 114 or the jumper leads 110, the sweep and length of the bond wires 116 can be controlled.

A section line 5-5 indicates the general region of the integrated circuit packaging system 100 that represents the cross-sectional view of FIG. 5.

Referring now to FIG. 5, therein is shown a cross-sectional view of an integrated circuit packaging assembly 501 along line 5-5 of FIG. 4 in molding phase of manufacturing. The cross-sectional view of the integrated circuit packaging assembly 501 depicts the lead frame 202 having the jumper leads 110, the covered contacts 104 and the coupling contacts 114 formed in a prior manufacturing step. The lead frame 202 can be formed by a combination stamping, etching, or both on a metal sheet that can be formed of copper (Cu), tin (Sn), or an alloy.

The deposited bond site 204 can be formed on the upper surface of the jumper leads 110, the covered contacts 104 and the coupling contacts 114 in order to enhance the coupling capability of the insulated bonding wires 112 and the bond wires 116. The deposited bond site 204 can be plated, sputtered, screen printed, or a combination thereof. It is understood that the deposited bond site 204 of the jumper leads 110 can be larger than the deposited contact of the covered contacts or the coupling contacts in order to provide two contact areas for the insulated bonding wires 112 and the bond wires 116.

The array of the system coupling sites 206 can be formed directly under the deposited bond sites 204 of the covered contacts 104 and the coupling contacts 114 but no system coupling sites 206 are formed under the jumper leads 110. The system coupling sites 206 can be plated, sputtered, or silk screened on the bottom side of the lead frame 202. The system coupling sites 206 can form an etch stop layer on the bottom of the lead frame 202 for further processing.

The die mounting adhesive 208, such as a "B" stage epoxy, die attach material, or as cured epoxy can fill the space beneath the integrated circuit die 102 to completely enclose the covered contacts 104 and the deposited bond sites 204. It is further understood that the die mounting adhesive 208 can be a material having a low-K dielectric constant.

The package encapsulation 210 can be formed on the integrated circuit die 102, the bond wires 116, the insulated bonding wires112, the die mounting adhesive 208, and the coupling contacts 114. The package encapsulation 210 does not extend beneath the integrated circuit die 102 so it does not come in contact with the covered contacts 104

Referring now to FIG. 6, therein is shown a cross-sectional view of the integrated circuit packaging system 400 of FIG. 4 in a lead isolation phase of manufacturing. The cross-sectional view of the integrated circuit packaging system 400 depicts the array 302 of the covered contacts 104 can be isolated from each other by the lead isolation process, such as etching or laser ablation.

The jumper leads 110 can be reduced in thickness by the lead isolation process. It is understood that the system contact site 206 is not present under the jumper leads 110 so they are fully reduced to an expected thickness and will not be coupled to the next level system (not shown). The reduction in thickness of the jumper lead 110 is capable of precision control in the manufacturing process.

The system contact site 206 can block the thinning process of the lead isolation process. The exposed areas of the lead frame 202 of FIG. 2 are reduced in thickness until all of the material coupling the jumper leads 110, the covered contacts 104 and the coupling contacts 114 has been removed. The package encapsulation 210 is exposed between the coupling contacts 114. The covered contacts 104 are completely surrounded by the die mounting adhesive 208.

Figure 7:
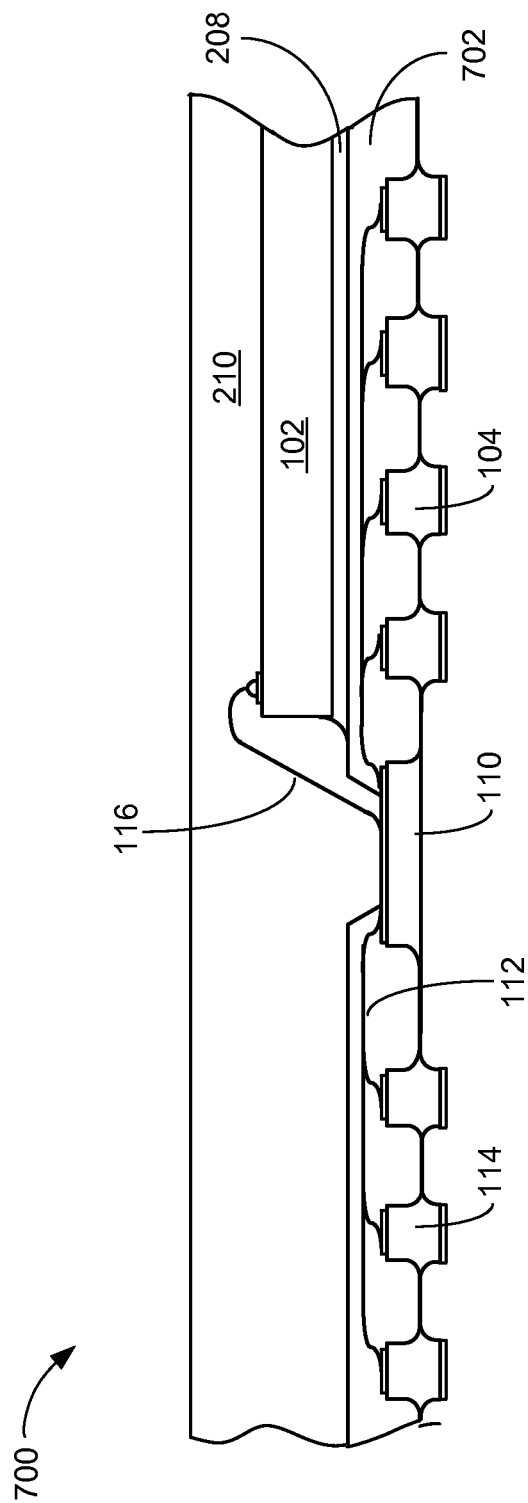
FIG. 7 is a cross-sectional view of an integrated circuit packaging system in a third embodiment of the present invention.

Referring now to FIG. 7, therein is shown a cross-sectional view of an integrated circuit packaging system 700 in a third embodiment of the present invention. The cross-sectional view of the integrated circuit packaging system 700 depicts the jumper leads 110 having the insulated bonding wires 112 coupled between the jumper leads 110 and both the covered contacts 104 and the coupling contacts 114. A first encapsulation 702 can encapsulate the insulated bonding wires 112, the covered contacts, 104, the coupling contacts 114 and portions of the jumper leads 110. A center portion of the jumper leads 110 remains exposed from the first encapsulation 702.

The first encapsulation 702 can be a low-K dielectric material, a solder mask, or an epoxy molding compound. The first encapsulation can be applied by molding, screen printing, sputtering, or the like. The die mounting adhesive 208 can adhere the integrated circuit die 102 to the first encapsulation 702. The bond wires 116 can couple the integrated circuit die 102 to the exposed portion of the jumper leads 110. The electrical signals sourced from or going to the integrated circuit die 102 are coupled through the jumper leads 110 and the insulated bonding wires 112 to an appropriate one of the coupling contacts 114 or the covered contacts 104.

The package encapsulation 210 can be formed on the integrated circuit die 102, the bond wires 116, the jumper leads 110, and the first encapsulation 702. It is understood that, once the assembly of the integrated circuit packaging system is complete, a singulation process would separate the individual packages by cutting through only the package encapsulation 210. The singulation process can include cutting with a saw, laser cutting, shearing, or the like.

Referring now to FIG. 8, therein is shown a top plan view of a substrate assembly 801 of the integrated circuit packaging system 700 of FIG. 7 in a substrate assembly forming phase of manufacturing. The top plan view of the substrate assembly 801 of the integrated circuit packaging system 700 depicts an access opening 802 in the first encapsulation 702 for exposing the jumper leads 110. The insulated bonding wires 112 can couple an individual unit of the jumper leads 110 to an individual unit of the covered contacts 104 or the coupling contacts 114.

It is understood that the insulated bonding wires 112 can form an electrical connection by coupling multiple units of the covered contacts 104 or the coupling contacts 114. It is also understood that the insulated bonding wires 112 can contact each other without forming an electrical connection and that an electrical connection is only possible at the end points of the insulated bonding wires 112.

By way of an example, only one row of the jumper leads 110 is shown but it is understood that more than one row of the jumper leads 110 can be implemented. The nature of the insulated bonding wires 112 allows forming an electrical connection in heavily congested areas that would be difficult or impossible to implement in a printed circuit board. This aspect of the present invention provides an increase in connectivity options while maintaining an inexpensive and manufacturable option for forming the substrate assembly 801. It has further been discovered that the present invention can provide a thinner implementation of a ball grid array substrate (not shown) because multiple layers of the printed circuit board of the ball grid array substrate can be replaced by a single layer of the jumper leads 110 and the insulated bonding wires 112.

Thus, it has been discovered that the integrated circuit packaging system and device of the present invention furnishes important and heretofore unknown and unavailable solutions, capabilities, and functional aspects for producing a thin, inexpensive, and manufacturable contact grid array package that can replace a thicker and more expensive ball grid array package.

Referring now to FIG. 9, therein is shown a cross-sectional view of the substrate assembly 801 of the integrated circuit packaging system of FIG. 7 in a first encapsulation phase of manufacturing. The cross-sectional view of the substrate assembly 801 depicts the lead frame 202 having the covered contacts 104, the coupling contacts 114, and the jumper leads 110.

The substrate assembly 801 can have the access opening 802 in the first encapsulation 702. The first encapsulation 702 can be a low-K dielectric material that provides additional electrical isolation between the insulated bonding wires 112 that can couple the jumper leads 110 to the covered contacts 104 or the coupling contacts 114. While the access opening 802 is shown having sloped sides, it is understood that the sides of the access opening 802 can be vertical.

Referring now to FIG. 10, therein is shown a cross-sectional view of a package assembly 1001 of the integrated circuit packaging system 700 of FIG. 7 in a second encapsulation phase of manufacturing. The cross-sectional view of the package assembly 1001 depicts the integrated circuit die 102 mounted by the die mounting adhesive 208 on the substrate assembly 801.

The bond wires 116 can couple the integrated circuit die 102 to the jumper leads 110. The package encapsulation 210 is formed on the integrated circuit die 102, the bond wires 116, the jumper leads 110, and the first encapsulation 702.

It is understood that the package assembly 1001 is fabricated in a sheet containing more than one of the package assembly 1001. In a subsequent singulation process the individual packages of the integrated circuit packaging system 700 can be separated by a singulation saw, a singulation laser, or a shear.

Figure 11:
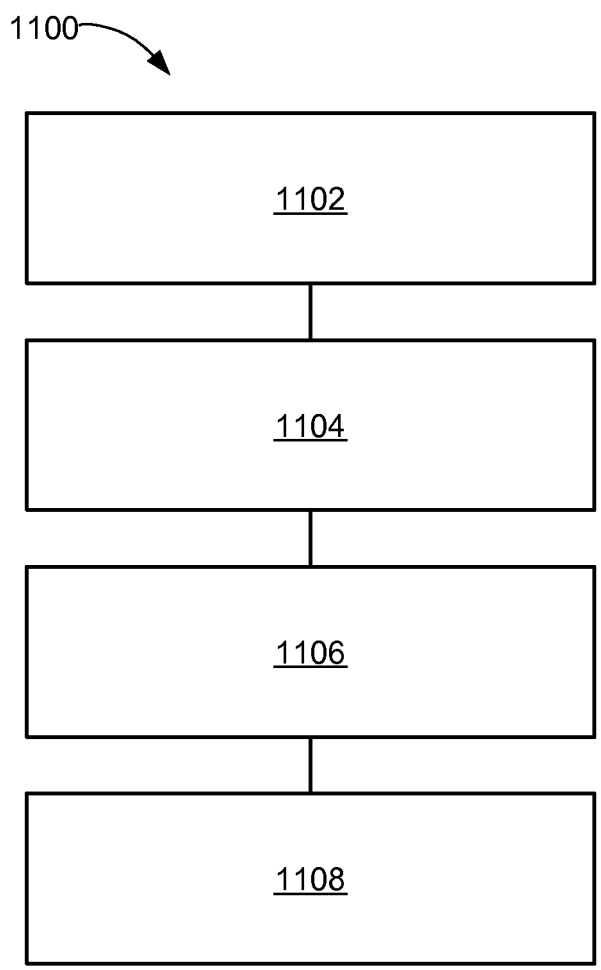
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: providing an array of leads having a jumper lead and a covered contact in a block 1102; coupling an insulated bonding wire between the jumper lead and the covered contact in a block 1104; attaching an integrated circuit die over the covered contact in a block 1106; and coupling a bond wire between the integrated circuit die and the jumper lead including coupling the integrated circuit die to the covered contact through the insulated bonding wire in a block 1108.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing an array of leads having a jumper lead and a covered contact;
   coupling an insulated bonding wire between the jumper lead and the covered contact;
   attaching an integrated circuit die over the covered contact; and
   coupling a bond wire between the integrated circuit die and the jumper lead including coupling the integrated circuit die to the covered contact through the insulated bonding wire.

2. The method as claimed in claim 1 further comprising forming a first encapsulation on the jumper lead, the insulated bonding wire and the covered contact.

3. The method as claimed in claim 1 further comprising molding a package encapsulation on the integrated circuit die, the bond wire and the jumper lead.

4. The method as claimed in claim 1 wherein coupling the insulated bonding wire between the jumper lead and the covered contact further comprising coupling a second insulated bonding wire between the covered contact and a second of the covered contact.

5. The method as claimed in claim 1 wherein providing the array of leads includes etching a lead frame for isolating the jumper lead and the covered contact.

6. A method of manufacture of an integrated circuit packaging system comprising:
   providing an array of leads having a jumper lead, a coupling contact, and a covered contact;

coupling an insulated bonding wire between the jumper lead and the covered contact;

attaching an integrated circuit die having bonding pads over the covered contact; and coupling a bond wire between the integrated circuit die and the jumper lead or the coupling contact including coupling the integrated circuit die to the covered contact through the insulated bonding wire.

7. The method as claimed in claim 6 further comprising forming a first encapsulation on the jumper lead, the insulated bonding wire, the coupling contact, and the covered contact.

8. The method as claimed in claim 6 further comprising molding a package encapsulation on the integrated circuit die, the bond wire and the jumper lead including isolating the covered contact from the package encapsulation.

9. The method as claimed in claim 6 wherein coupling the insulated bonding wire between the jumper lead and the covered contact further comprising coupling a second insulated bonding wire between the covered contact and a second of the covered contact or coupling the second insulated bonding wire between a first of the coupling contact and a second of the coupling contact.

10. The method as claimed in claim 6 wherein providing the array of leads includes etching a lead frame for isolating the jumper lead and the covered contact including etching the coupling contact and an array of the covered contacts.

11. An integrated circuit packaging system comprising:
an array of leads includes a jumper lead and a covered contact;
an insulated bonding wire attached between the jumper lead and the covered contact;
an integrated circuit die mounted over the covered contact; and
a bond wire coupled between the integrated circuit die and the jumper lead includes the integrated circuit die coupled to the covered contact through the insulated bonding wire.

12. The system as claimed in claim 11 further comprising a first encapsulation formed on the jumper lead, the insulated bonding wire and the covered contact.

13. The system as claimed in claim 11 further comprising a package encapsulation molded on the integrated circuit die, the bond wire and the jumper lead.

14. The system as claimed in claim 11 wherein the insulated bonding wire coupled between the jumper lead and the covered contact includes a second insulated bonding wire coupled between the covered contact and a second of the covered contact.

15. The system as claimed in claim 11 wherein the array of leads includes the jumper lead and the covered contact having evidence of being etched from a lead frame.

16. The system as claimed in claim 11 further comprising:
a coupling contact in the array of leads; and
wherein:
the bond wire coupled between the integrated circuit die and the jumper lead or the coupling contact.

17. The system as claimed in claim 16 further comprising a first encapsulation formed on the jumper lead, the insulated bonding wire, the coupling contact, and the covered contact.

18. The system as claimed in claim 16 further comprising a package encapsulation molded on the integrated circuit die, the bond wire and the jumper lead includes the covered contact isolated from the package encapsulation.

19. The system as claimed in claim 16 wherein the insulated bonding wire coupled between the jumper lead and the covered contact includes a second insulated bonding wire coupled between the covered contact and a second of the covered contact or the second insulated bonding wire coupled between a first of the coupling contact and a second of the coupling contact.

20. The system as claimed in claim 16 wherein the array of leads includes the jumper lead and the covered contact having evidence of being etched from a lead frame includes the coupling contact and an array of the covered contacts isolated by a lead frame etched.

* * * * *